US011861191B2

(12) United States Patent
Huo

(10) Patent No.: US 11,861,191 B2
(45) Date of Patent: Jan. 2, 2024

(54) PARAMETER TABLE PROTECTION FOR A MEMORY SYSTEM

(71) Applicant: Micron Technology, Inc., Boise, ID (US)

(72) Inventor: Binbin Huo, Taufkirchen (DE)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 17/500,676

(22) Filed: Oct. 13, 2021

(65) Prior Publication Data

US 2023/0110377 A1    Apr. 13, 2023

(51) Int. Cl.
   G06F 3/06   (2006.01)

(52) U.S. Cl.
   CPC .......... G06F 3/0632 (2013.01); G06F 3/0604 (2013.01); G06F 3/0679 (2013.01)

(58) Field of Classification Search
   CPC ..... G06F 3/0632; G06F 3/0604; G06F 3/0679
   See application file for complete search history.

(56) References Cited

U.S. PATENT DOCUMENTS

| | | | | |
|---|---|---|---|---|
| 9,633,738 B1* | 4/2017 | Guo | ...................... | G11C 16/30 |
| 10,083,754 B1* | 9/2018 | Chen | .................... | G11C 7/1006 |
| 11,372,700 B1* | 6/2022 | Kuramoto | ........... | G06F 12/0802 |
| 2011/0072331 A1* | 3/2011 | Sakaue | ............... | G06F 11/1012 |
| | | | | 714/763 |
| 2016/0055056 A1* | 2/2016 | Son | ..................... | G06F 11/1068 |
| | | | | 714/764 |
| 2016/0246672 A1* | 8/2016 | Yang | ....................... | G06F 3/064 |
| 2019/0339888 A1* | 11/2019 | Sasidharan | ........... | G06F 3/0679 |
| 2020/0167227 A1* | 5/2020 | Her | ..................... | G06F 9/30101 |
| 2020/0192749 A1* | 6/2020 | Richter | ............... | G06F 11/1048 |
| 2022/0269603 A1* | 8/2022 | Ravimohan | ......... | G06F 12/0246 |

* cited by examiner

Primary Examiner — Edward J Dudek, Jr.

(74) Attorney, Agent, or Firm — Holland & Hart LLP

(57) ABSTRACT

Methods, systems, and devices for parameter table protection for a memory system are described. Upon booting a memory system for a first time, the memory system or a host system may generate an error control code associated with parameter data stored to the memory system. The error control code may be stored to the memory system and may be configured to correct one or more errors in the parameter data upon subsequent boot sequences of the memory system. Accordingly, upon booting the memory system for a second or a subsequent time, the error control code may be used to identify and correct errors in the parameter data, which may reduce the quantity of copies of parameter data stored to the memory system and may prevent the memory system from experiencing a system crash.

25 Claims, 10 Drawing Sheets

PARAMETER TABLE PROTECTION FOR A MEMORY SYSTEM

FIELD OF TECHNOLOGY

The following relates generally to one or more systems for memory and more specifically to parameter table protection for a memory system.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
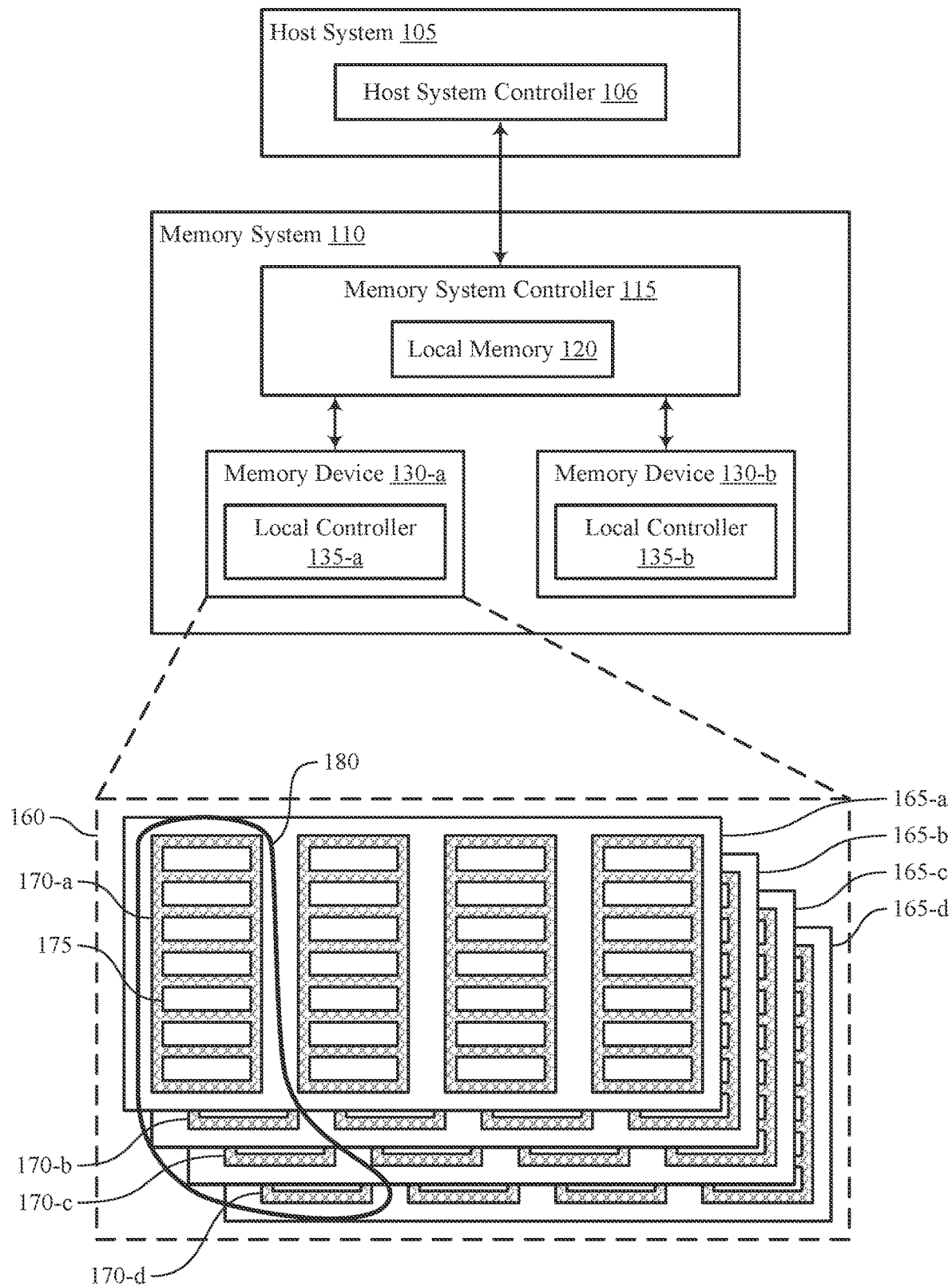
FIG. 1 illustrates an example of a system that supports parameter table protection for a memory system in accordance with examples as disclosed herein.

Some memory systems, such as non-volatile memory systems (e.g., memory systems that include non-volatile memory cells, such as NAND memory cells or Flash memory cells), may store data (e.g., parameter data) that contains information about the memory system. For example, the parameter data may instruct the memory system what commands it can perform, how to interface with a host system, what standard (or standards) the memory system is capable of employing, and other vital information. In some instances, the parameter data may not be able to be modified by a user of the memory system (e.g., a user may not be able to write, erase, or otherwise alter the data). As such, if the parameter data becomes corrupt (e.g., if one or more bits of the data become corrupt), the memory system may be incapable of functioning properly.

To account for this issue, some memory systems may store multiple copies of parameter data. For example, a memory system may include n copies of the data (e.g., in a table format) such that, if one copy becomes corrupt, the copy can be replaced to ensure the memory system functions properly. However, a single copy of parameter data occupies a large storage area of the memory system, thus storing multiple copies may diminish the amount of storage available to the memory system for storing other data. Accordingly, a memory system configured to correct errors in parameter data and thus reduce the quantity of stored copies may be desirable.

A memory system configured to correct errors associated with parameter data is described herein. In some examples, a memory system may store data that contains instructions about what commands the memory system can perform, how the memory system interfaces with a host system, what standard (or standards) the memory system is capable of employing, and other vital information. Such data, which may be stored in a table at the memory system, may be collectively referred to as "parameter data." In some instances, when the parameter data becomes corrupt (e.g., when one or more bits of the parameter table "flip" to an incorrect bit value), the memory system or a host system coupled with the memory system may identify and correct the error using an error control code (ECC).

In some examples, when a memory system boots for a first time, an ECC for the parameter data may be generated. The ECC may be generated either by the memory system or by the host system. Accordingly, during subsequent boot sequences, the memory system or host system may use the ECC to identify and correct the errors. In some instances, an error may occur when a single bit in the parameter data flips to an incorrect bit value (e.g., flips from a "1" to a "0" or vice versa). Such errors may be referred to herein as "bitflips", although the parameter data may be subject to other types of errors that are correctable by the ECC.

Additionally or alternatively, the ECC generated by the memory system or host system may be configured to correct a finite quantity of errors of the parameter data. Thus, each time an error is corrected (e.g., during a single boot process), the memory system or host system may increment a counter. If the quantity of errors corrected satisfies a threshold value (e.g., a quantity of errors that the ECC is capable of correcting), a new ECC may be generated or selected. The new ECC (e.g., the ECC selected or generated when the threshold value is satisfied) may be configured to correct a different (e.g., a larger) quantity of errors than the prior ECC. Because the size and complexity of an ECC may depend on the quantity of errors it is configured to correct, employing a counter to determine when to generate or select another ECC may reduce the amount of storage of the memory device that is occupied by the ECC. Moreover, by utilizing an ECC to correct errors in parameter data, fewer copies of the parameter data may be stored to the memory system, which may improve the overall storage capabilities of the memory system.

Figure 2:
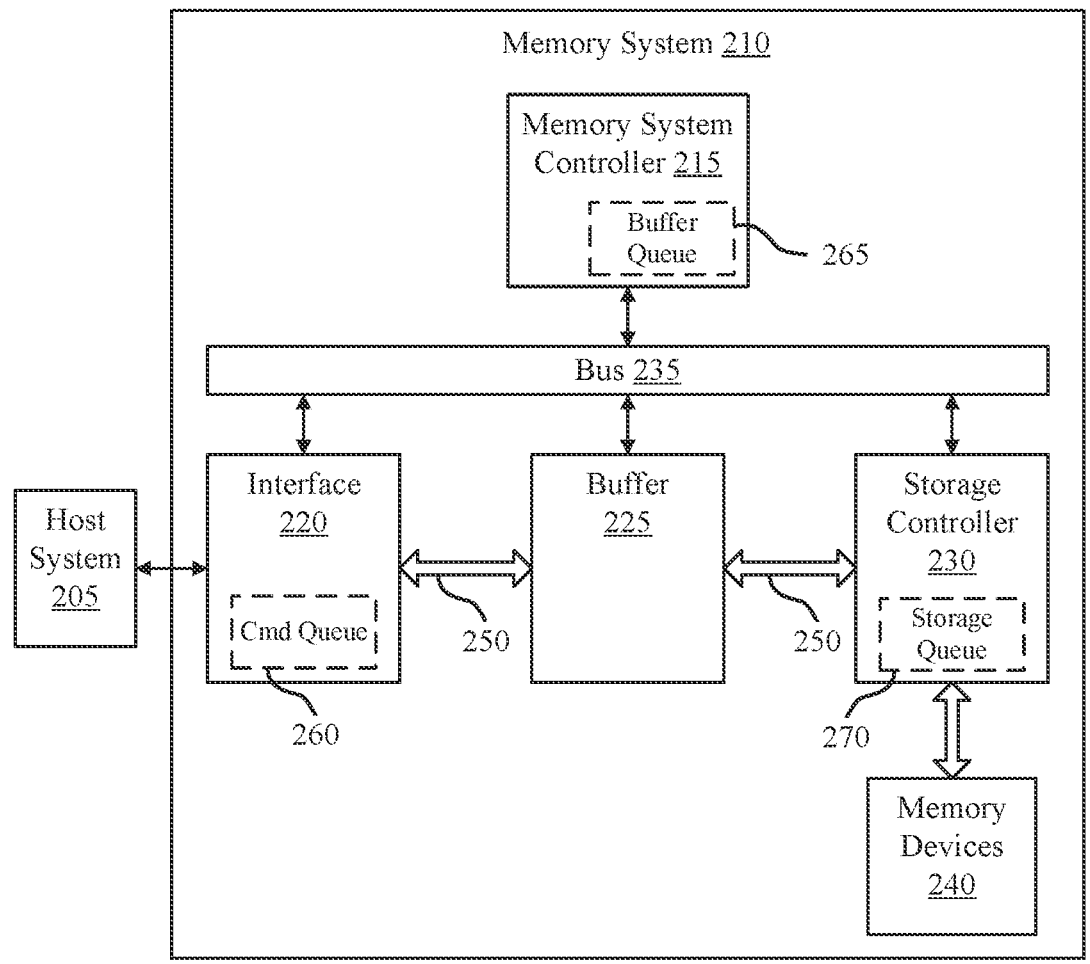
FIG. 2 illustrates an example of a system that supports parameter table protection for a memory system in accordance with examples as disclosed herein.

Features of the disclosure are initially described in the context of systems, devices, and circuits with reference to FIGS. 1 through 2. Features of the disclosure are described in the context of process flow diagrams with reference to FIGS. 3-6. These and other features of the disclosure are further illustrated by and described in the context of block diagrams and flowcharts that relate to parameter table protection for a memory system with reference to FIGS. 7-10.

FIG. 1 illustrates an example of a system 100 that supports parameter table protection for a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165 c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support parameter table protection for a memory system. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some examples, the memory system 110 may store parameter data at one or more memory devices 130 or at the local memory 120. As described herein, the host system 105 or the memory system 110 (e.g., the memory system controller 115) may be configured to generate an ECC in order to correct errors in the parameter data. For example, upon booting the memory system 110 for a first time, the memory system controller 115 may generate and store an ECC. Thus, upon subsequent boot sequences, the memory system controller 115 may identify (e.g., using the ECC) one or more errors in the parameter data. Accordingly, the ECC may be used to correct the error(s), which may allow for the memory system 110 to function properly (e.g., to avoid a boot failure and, subsequently, a system crash).

In other examples, upon booting the memory system 110 for a first time, the memory system controller 115 may transmit a copy of the parameter data to the host system 105. The host system 105, upon receiving the copy of the parameter data, may generate an ECC and transmit the ECC to the memory system 110 for storage. Thus, upon subsequent boot sequences of the memory system 110, the host system 105 may receive a copy of the parameter data and access the ECC (e.g., stored at the memory system 110) to identify and correct one or more errors in the parameter data. Accordingly, the host system 105 may transmit the corrected parameter data to the memory system 110, and the memory system controller 115 may store the corrected parameter data as a new copy or overwrite the existing (e.g., corrupt) copy. By utilizing an ECC to correct errors in parameter data, either by the host system 105 or by the memory system 110, fewer copies of the parameter data may be stored to the memory system 110, which may improve its overall storage capabilities.

FIG. 2 illustrates an example of a system 200 that supports parameter table protection for a memory system in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

In some examples, the memory system 210 may store parameter data at one or more memory devices 240. As described herein, the host system 205 or the memory system 210 (e.g., the memory system controller 215) may be configured to generate an ECC in order to correct errors in the parameter data. For example, upon booting the memory system 210 for a first time, the memory system controller 215 may generate and store an ECC. Thus, upon subsequent boot sequences, the memory system controller 215 may identify (e.g., using the ECC) one or more errors in the parameter data. Accordingly, the ECC may be used to correct the error(s), which may allow for the memory system 210 to function properly (e.g., to avoid a boot failure and, subsequently, a system crash).

In other examples, upon booting the memory system 210 for a first time, the memory system controller 215 may transmit a copy of the parameter data to the host system 205. The host system 205, upon receiving the copy of the parameter data, may generate an ECC and transmit the ECC to the memory system 210 for storage. Thus, upon subsequent boot sequences of the memory system 210, the host system 205 may receive a copy of the parameter data and access the ECC (e.g., stored at the memory system 210) to identify and correct one or more errors in the parameter data. Accordingly, the host system 205 may transmit the corrected parameter data to the memory system 210, and the memory system controller 215 may store the corrected parameter data as a new copy or overwrite the existing (e.g., corrupt) copy. By utilizing an ECC to correct errors in parameter data, either by the host system 205 or by the memory system 210, fewer copies of the parameter data may be stored to the memory system 210, which may improve its overall storage capabilities.

Figure 3:
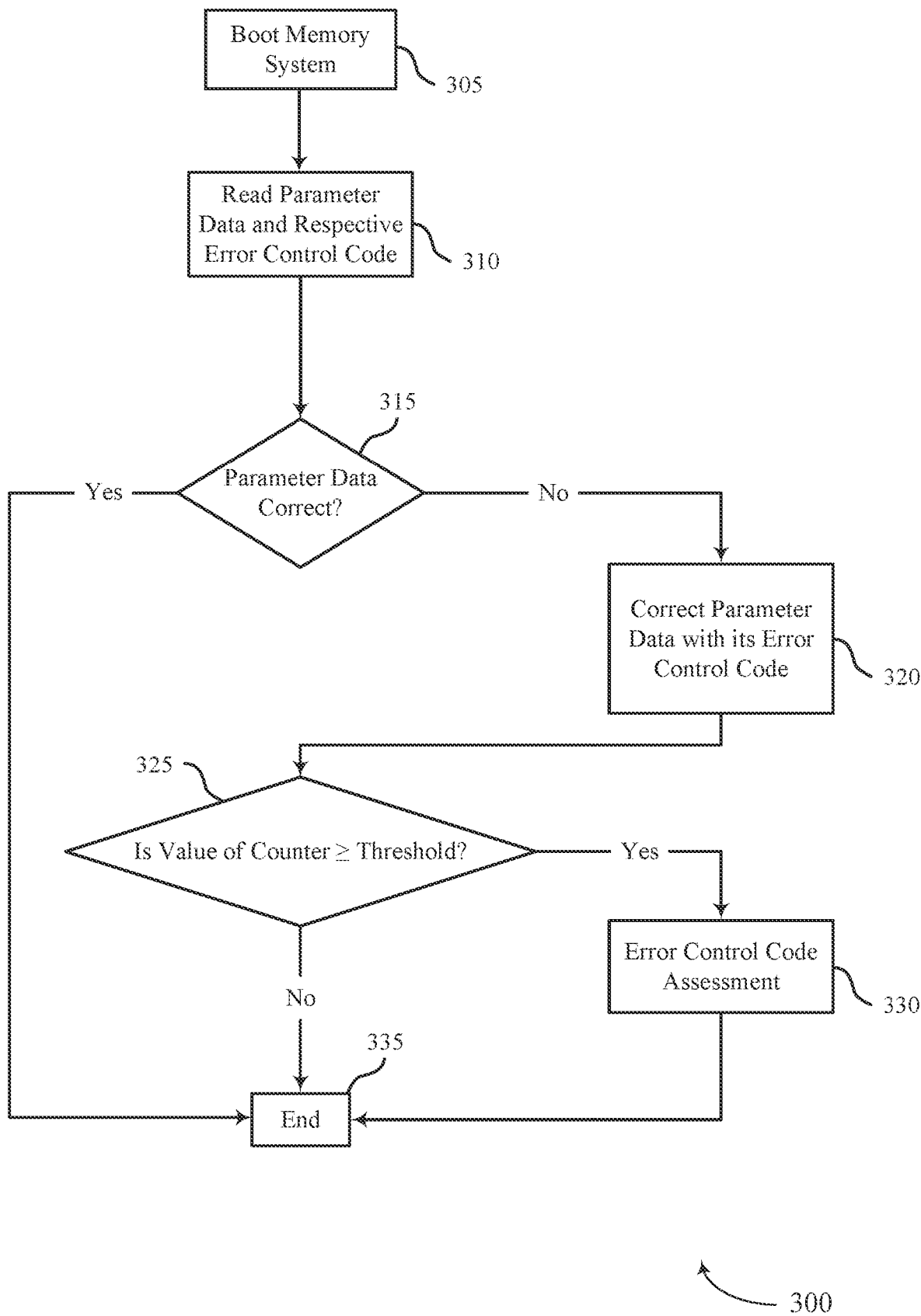
FIGS. 3 through 5 illustrate examples of process flow diagrams that support parameter table protection for a memory system in accordance with examples as disclosed herein.

FIG. 3 illustrates an example of a process flow diagram 300 that supports parameter table protection for a memory system in accordance with examples as disclosed herein. In some examples, the process flow diagram 300 may implement aspects of system 100, system 200, or a combination thereof. Accordingly, the operations described by the process flow diagram 300 may be performed at or by a host system (e.g., a host system 105 as described with reference to FIG. 1, a host system 205 as described with reference to FIG. 2), a memory system (e.g., a memory system 110 as described with reference to FIG. 1, a memory system 210 as described with reference to FIG. 2), or a combination thereof. The operations described with reference to FIG. 3 may result in the generation of an ECC, which can be used to identify and correct errors in parameter data. By utilizing an ECC to correct errors in parameter data, either by a host system or by a memory system, fewer copies of the parameter data may be stored to the memory system, which may improve its overall storage capabilities.

FIG. 3 may illustrate operations performed by a host system or a memory system after an ECC is generated. That is, upon booting a memory system for a first time (e.g., a first occurrence after manufacturing, after installation, etc.), the memory system or the host system may generate an original ECC, which may be stored to the memory system and used to identify and correct errors in parameter data (e.g., parameter data stored to the memory system). As used herein, booting a memory system may refer to the process of providing power to one or more hardware components of the memory system or initiating software stored to one or more aspects of the memory system. In some instances, if the memory system stores more than one copy of parameter data, an ECC may be generated for each copy of the stored parameter data. Moreover, the ECC generated may be an example of an error correction code, an error control code, or an error detection code. Accordingly, FIG. 3 illustrates subsequent boot sequences of the memory system where errors in the parameter data may be identified and corrected using the ECC.

At block 305, a memory system may initiate a boot up process. As described above, the memory system may have already experienced an initial boot sequence, thus the boot sequence at block 305 may be a second (or a subsequent) boot sequence (e.g., a second or subsequent occurrence of the memory system booting) where an ECC has already been generated and stored to the memory system.

At block 310, the parameter data and corresponding ECC may be read from the memory system. As described herein, the parameter data and ECC may be read from the memory system, but either the memory system or the host system may use the ECC to correct errors in the parameter data. Accordingly, for on-die error correction (e.g., error correction performed by the memory system), at block 310 a memory controller or other component of the memory system may read the parameter data and ECC in order to identify and correct errors in the parameter data. In other examples, for host system error correction (e.g., error correction performed by the host system), at block 310 the parameter data may be transmitted to the host system and the host system may subsequently access the ECC stored at the memory system to identify and correct errors in the parameter data.

At block 315, either the memory system or the host system may determine whether the parameter data includes one or more errors (e.g., any bitflips or other types of errors). For on-die error correction, a memory controller or other component of the memory system may generate an ECC based on the current parameter data and may compare the generated ECC to the original ECC (e.g., the ECC generated and stored upon booting the memory system for a first time). In other examples, the host system may generate an ECC based on the received parameter data and may compare the generated ECC to the original ECC (e.g., the ECC generated and stored upon booting the memory system for a first time). In either instance, if the ECCs match, the parameter data is error-free. However, if the ECCs don't match then the parameter data may contain one or more errors, which may be due to one or more bits "flipping" (e.g., inadvertently changing from a "1" to a "0" or vice versa). If the parameter data is correct (e.g., if the parameter data does not contain any errors), the process flow may proceed to block 335, whereas if the parameter data includes one or more errors, the process flow may proceed to block 320.

At block 320, the host system or the memory system may correct one or more errors in the parameter data. For example, if the host system or memory system determines instances of bitflips in the parameter data, the host system or the memory system may use the originally generated ECC to correct the parameter data, which may allow the memory system to boot properly. For on-die error correction, a memory controller or other component of the memory system may correct the parameter data and may store the corrected parameter data to the memory system. For error correction performed by the host system, the host system may correct the parameter data and transmit the corrected parameter data back to the memory system for storage. In either instance, the corrected parameter data may be stored as a new copy, while in other instances the corrupt parameter data may be overwritten by the corrected parameter data.

In some examples (not shown), either the host system or the memory system may increment a counter for each error in the parameter data that is corrected. The counter may be located at and/or managed by either the memory system (e.g., a memory controller of the memory system) or by the host system. For example, upon correcting a first error for a first time, the counter may be incremented (e.g., from "0" to "1") and upon correcting a second error for a first time, the counter may again be incremented (e.g., from "1" to "2") and so forth. In some instances, the counter may be reset each time the memory system reboots.

At block 325, after correcting the parameter data at 320 and incrementing a value of the counter, the value of the counter may be compared with a threshold value. The threshold value may be less than the total quantity of errors that the ECC is capable of correcting. For example, the ECC may be configured to correct a fixed quantity of errors and the threshold may be based off of the fixed quantity (e.g., threshold=¾×maximum quantity of correctable errors). By setting the threshold value less than the total quantity of errors the ECC is configured to correct, the memory system may be less susceptible to aliasing during subsequent error correction operations. Accordingly, either the host system or the memory system may be configured to compare the value of the counter to the threshold. If the value of the counter satisfies the threshold value, the host system or memory system may perform an ECC assessment at block 330, whereas if the value of the counter does not satisfy the threshold value, the process flow may proceed to block 335.

At block 330, the memory system or the host system may conduct an ECC assessment based on the value of the counter satisfying the threshold. In a first example of the host system or memory system performing an ECC assessment, the memory system or host system may generate a second ECC using the corrected parameter data. For example, the second ECC may be configured to correct a greater quantity of errors than the originally generated ECC. As such, during subsequent boot operations, the memory system or host system may use the second ECC to identify and correct errors, which may allow the memory system or host system to correct a larger quantity errors than it was previously capable of. Moreover, upon generating the ECC, the memory system or host system may update the threshold value (e.g., the threshold used at block 325) to account for the second ECC being able to correct a larger quantity of errors.

In a second example of the host system or the memory system performing an ECC assessment, the memory system or host system may generate multiple ECCs upon the first boot sequence of the memory system. For example, the memory system or the host system may generate a set of ECCs associated with the parameter data, where each ECC is configured to correct a different quantity of errors. Accordingly, when the memory system or host system determines that a value of the counter exceeds the threshold quantity of errors correctable by the ECC, the memory system or the host system may select a new (e.g., a second) ECC for use. The second ECC may be configured to correct a larger quantity of errors than the prior ECC. Upon the value of the counter satisfying the threshold value again, the memory system or the host system may continue to select an ECC capable of correcting a larger quantity of errors than the prior ECC.

In a third example of the host system or the memory system performing an ECC assessment, the memory system or host system may store corrected parameter data at different location than the prior parameter data (e.g., the corrupt parameter data) was stored. For example, the corrupt parameter data may be stored at a first portion of the memory system and, upon correction, the corrected parameter data may be stored to a second portion of the memory system. In any instance, by utilizing an ECC to correct errors in parameter data, either by a host system or by a memory system, fewer copies of the parameter data may be stored to the memory system, which may improve its overall storage capabilities.

Figure 4:
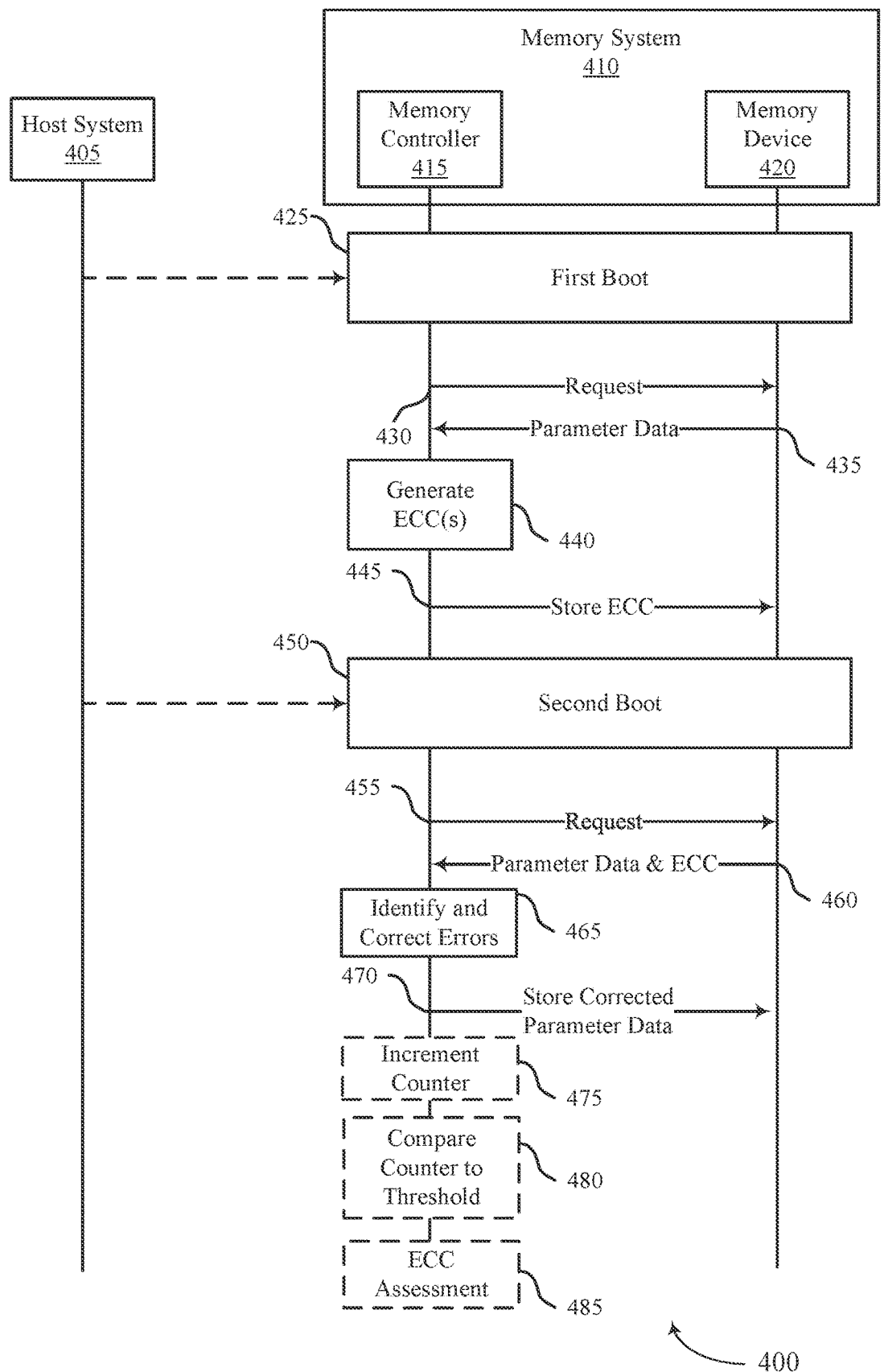

FIG. 4 illustrates an example of a process flow diagram 400 that supports parameter table protection for a memory system in accordance with examples as disclosed herein. In some examples, the process flow diagram 400 may implement aspects of system 100, system 200, or a combination thereof. Accordingly, the operations described by the process flow diagram 400 may be performed at or by a host system 405, a memory system 410, or a combination thereof. The operations described with reference to FIG. 4 may result in the generation of an ECC by memory system 410, which can be used to identify and correct errors in parameter data. By utilizing an ECC to correct errors in parameter data, fewer copies of the parameter data may be stored to the memory system 410, which may improve its overall storage capabilities.

At 425, the memory system 410 may boot up for a first time (e.g., a first boot sequence may occur at the memory system 410). As described herein, the first occurrence of a memory system 410 booting may be after manufacturing the memory system 410, during a first testing operation of the memory system 410, after installing the memory system 410 in a product, or a similar situation. As used herein, booting a memory system 410 may refer to the process of providing power to one or more hardware components of the memory system 410 or initiating software stored to one or more aspects of the memory system 410. In some instances, initiating software stored to one or more aspects of the memory system 410 may be initiated by signaling received from the host system 405.

At 430, the memory controller 415 may transmit a request to the memory device 420 for parameter data stored to the memory device 420. In some instances, the parameter data may have been stored to the memory device 420 during manufacturing (e.g., the parameter data may be hardcoded to the memory device 420). In some instances, the parameter data may be stored to a dedicated portion of the memory device 420, for example a portion of the memory device 420 that is dedicated to storing operational data such as the parameter data. The request transmitted at 430 may initiate reading the parameter data from the memory device 420. At 435, the parameter data may be communicated from the memory device 420 to the memory controller 415.

At 440, the memory controller 415 may generate one or more ECCs that are associated with the parameter data. As described herein, in some examples the memory controller 415 may generate a single ECC that is configured to correct a fixed quantity of errors in the parameter data during subsequent boot operations. However, in other examples, the memory controller 415 may generate multiple ECCs that are each configured to correct a different fixed quantity of errors. Accordingly, when multiple ECCs are generated, the memory controller 415 may be configured select a different ECC (e.g., an ECC configured to correct a larger quantity of errors) when a threshold quantity of errors in the parameter data are corrected. Selecting a different ECC when a threshold quantity of errors are correct may prevent aliasing from occurring.

At 445, the memory controller 415 may store the ECC(s) to the memory device 420. In some examples, the ECC(s) may be stored to a same portion of the memory device 420 as the parameter data. In other examples, the ECC(s) may be stored to a portion of the memory device dedicated for storing error correcting or error detecting codes.

At 450, the memory system 410 may boot up for a second time (e.g., a second boot sequence may occur at the memory system 410). As described herein, the second occurrence of a memory system 410 booting may occur when power is provided to one or more hardware components of the memory system 410 or when software stored to one or more aspects of the memory system 410 is initiated. In some instances, initiating software stored to one or more aspects of the memory system 410 may be initiated by signaling received from the host system 405.

At 455, the memory controller 415 may transmit a request to the memory device 420 for the parameter data and the ECC stored to the memory device 420 (e.g., at 445). The request transmitted at 430 may initiate reading the parameter data and the ECC from the memory device 420. At 460, the parameter data and the ECC may be communicated from the memory device 420 to the memory controller 415.

At 465, the memory controller 415 may identify and correct errors included in the parameter data. In some instances, the memory controller 415 may identify and correct errors in the parameter data by generating an ECC (e.g., a second ECC) based on the current parameter data and comparing the second ECC to the ECC received from the memory device 420. If the ECCs match, then the parameter data may not include any errors. However, if the ECCs do not match, one or more errors may exist and the memory controller 415 may use the ECC received from the memory device 420 to correct the parameter data.

At 470, the memory controller 415 may store the corrected parameter data to the memory device 420. In some examples, the memory controller 415 may overwrite the existing parameter data with the corrected parameter data, whereas in other examples the memory controller 415 may save the parameter data to a different location of the memory device 420.

At 475, the memory controller 415 may increment a counter for each error in the parameter data that is corrected. The counter may be located at and/or managed by the memory controller 415. For example, upon correcting a first error for a first time, the counter may be incremented (e.g., from "0" to "1") and upon correcting a second error for a first time, the counter may again be incremented (e.g., from "1" to "2") and so forth. In some instances, the counter may be reset each time the memory system 410 reboots.

At 480, the memory controller 415 may compare a value of the counter to a threshold value, which may be less than the total quantity of errors that the ECC is capable of correcting. For example, the ECC may be configured to correct a fixed quantity of errors and the threshold may be based off of the fixed quantity (e.g., $$\text{threshold} = \frac{3}{4} \times \text{maximum quantity of correctable errors}$$

By setting the threshold value less than the total quantity of aliasing during subsequent error correction operations. Accordingly, the memory controller 415 may be configured to compare the value of the counter to the threshold. If the value of the counter satisfies the threshold value, the memory controller 415 may perform an ECC assessment (e.g., at 485), whereas if the value of the counter does not satisfy the threshold value, the memory system 410 may continue its boot sequence.

At 485, the memory controller 415 conduct an ECC assessment based on the value of the counter satisfying the threshold. In a first example, the memory controller 415 may generate a second ECC using the corrected parameter data. For example, the second ECC may be configured to correct a greater quantity of errors than the originally generated ECC. As such, during subsequent boot operations, the memory controller 415 may use the second ECC to identify and correct errors, which may allow the memory controller 415 to correct a larger quantity errors than it was previously capable of. Moreover, upon generating the ECC, the memory controller 415 may update the threshold value (e.g., the threshold used at block 325) to account for the second ECC being able to correct a larger quantity of errors.

In a second example, the memory controller 415 may generate multiple ECCs upon the first boot sequence of the memory system 410. As described above, the memory controller 415 may have generated multiple ECCs (e.g., at 440). Accordingly, when the memory controller 415 determines that a value of the counter exceeds the threshold quantity of errors correctable by the ECC, the memory controller 415 may select a new (e.g., a second) ECC for use. The second ECC may be configured to correct a larger quantity of errors than the prior ECC.

In a third example, the memory controller 415 may store corrected parameter data at different location than the prior parameter data (e.g., the corrupt parameter data) was stored. For example, the corrupt parameter data may be stored at a first portion of the memory device 420 and, upon correction, the corrected parameter data may be stored to a second portion of the memory device 420.

In some instances, some aspects of the process flow diagram 400 may instead be performed by the host system 405 (e.g., as opposed to the memory controller 415) as described below with reference to FIG. 5. For example, the generated ECC (e.g., at 440) may instead be generated by the host system 405, or the host system 405 may identify and correct errors in the parameter data (e.g., at 465), increment the counter (e.g., at 475), compare the counter to a threshold (e.g., at 480), and/or perform an ECC assessment (e.g., at 485). The operations performed by the host system 405 and the memory system 410 may be a matter of design choice that are selected during manufacturing of the respective components. In any instance, by utilizing an ECC to correct errors in parameter data, fewer copies of the parameter data may be stored to the memory device 420, which may improve its overall storage capabilities.

Figure 5:
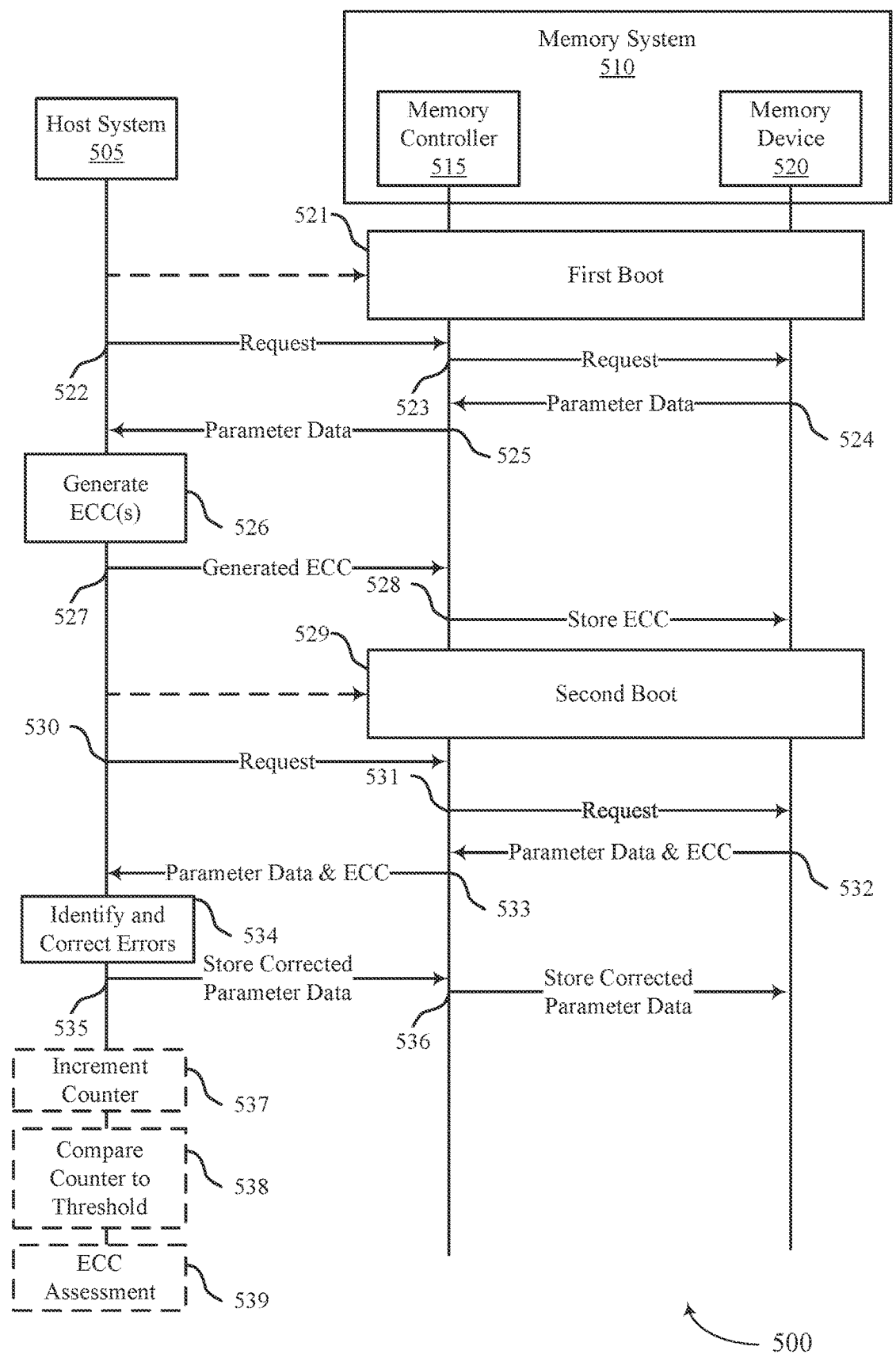

FIG. 5 illustrates an example of a process flow diagram 500 that supports parameter table protection for a memory system in accordance with examples as disclosed herein. In some examples, the process flow diagram 500 may implement aspects of system 100, system 200, or a combination thereof. Accordingly, the operations described by the process flow diagram 500 may be performed at or by a host system 505, a memory system 510, or a combination thereof. The operations described with reference to FIG. 5 may result in the generation of an ECC by the host system 505, which can be used to identify and correct errors in parameter data. By utilizing an ECC to correct errors in parameter data, fewer copies of the parameter data may be stored to the memory system 510, which may improve its overall storage capabilities.

At 521, the memory system 510 may boot up for a first time (e.g., a first boot sequence may occur at the memory system 510). As described herein, the first occurrence of a memory system 510 booting may be after manufacturing the memory system 510, during a first testing operation of the memory system 510, after installing the memory system 510 in a product, or a similar situation. As used herein, booting a memory system 510 may refer to the process of providing power to one or more hardware components of the memory system 510 or initiating software stored to one or more aspects of the memory system 510. In some instances, initiating software stored to one or more aspects of the memory system 510 may be initiated by signaling received from the host system 505.

At 522, the host system 505 may transmit a request to the memory controller 515 for parameter data stored to the memory device 520. In some instances, the parameter data may have been stored to the memory device 520 during manufacturing (e.g., the parameter data may be hardcoded to the memory device 520). In some instances, the parameter data may be stored to a dedicated portion of the memory device 520, for example a portion of the memory device 520 that is dedicated to storing operational data such as the parameter data. At 523, the memory controller 515 may transmit the request from the host system 505 to the memory device 520. In other examples, the memory controller 515 may receive the request and generate another request (e.g., a second request) that is transmitted to the memory device 520. The request (e.g., at 523) may initiate reading the parameter data from the memory device 520. At 524, the parameter data may be communicated from the memory device 520 to the memory controller 515, and at 525 the memory controller 515 may transmit the parameter data to the host system 505. In other examples, the parameter data may be communicated directly to the host system 505.

At 526, the host system 505 may generate one or more ECCs that are associated with the parameter data. As described herein, in some examples the host system 505 may generate a single ECC that is configured to correct a fixed quantity of errors in the parameter data during subsequent boot operations. However, in other examples, the host system 505 may generate multiple ECCs that are each configured to correct a different fixed quantity of errors. Accordingly, when multiple ECCs are generated, the host system 505 may be configured to select a different ECC (e.g., an ECC configured to correct a larger quantity of errors) when a threshold quantity of errors in the parameter data are corrected. Selecting a different ECC when a threshold quantity of errors are correct may prevent aliasing from occurring.

At 527, the host system 505 may transmit the generated ECC(s) to the memory controller 515 and at 528, the memory controller 515 may store the ECC(s) to the memory device 520. In some examples, the ECC(s) may be stored to a same portion of the memory device 520 as the parameter data. In other examples, the ECC(s) may be stored to a portion of the memory device dedicated for storing error correcting or error detecting codes.

At 529, the memory system 510 may boot up for a second time (e.g., a second boot sequence may occur at the memory system 510). As described herein, the second occurrence of a memory system 510 booting may occur when power is provided to one or more hardware components of the memory system 510 or when software stored to one or more aspects of the memory system 510 is initiated. In some instances, initiating software stored to one or more aspects of the memory system 510 may be initiated by signaling received from the host system 505.

At 530, the host system 505 may transmit a request to the memory controller 515 for the parameter data and the ECC stored to the memory device 520 (e.g., at 528). At 531, the memory controller 515 may relay the request transmitted from the host system 505 which may initiate reading the parameter data and the ECC from the memory device 520. In other examples, the memory controller 515 may receive the request and generate another request (e.g., a second request) that is transmitted to the memory device 520. The request (e.g., at 531) may initiate reading the parameter data from the memory device 520.

At 532, the parameter data and the ECC may be communicated from the memory device 520 to the memory controller 515 and at 533, the memory controller 515 may transmit the parameter data and the ECC to the host system 505. In other examples, the parameter data and ECC may be communicated directly to the host system 505.

At 534, the host system 505 may identify and correct errors included in the parameter data. In some instances, the host system 505 may identify and correct errors in the parameter data by generating an ECC (e.g., a second ECC) based on the current parameter data and comparing the second ECC to the ECC received from the memory device 520 (or the memory controller 515). If the ECCs match, then the parameter data may not include any errors. However, if the ECCs do not match, one or more errors may exist and the host system 505 may use the ECC received from the memory device 520 to correct the parameter data.

At 535, the host system 505 may transmit the corrected parameter data to the to the memory controller 515 and at 536, the memory controller 515 may store the corrected parameter data to the memory device 520. In other examples, the host system 505 may transmit the corrected parameter data directly to the memory device 520. In some examples, the host system 505 or the memory controller 515 may overwrite the existing parameter data with the corrected parameter data, whereas in other examples the host system 505 or the memory controller 515 may save the parameter data to a different location of the memory device 520.

At 537, the host system 505 may increment a counter for each error in the parameter data that is corrected. The counter may be located at and/or managed by the host system 505. For example, upon correcting a first error for a first time, the counter may be incremented (e.g., from "0" to "1") and upon correcting a second error for a first time, the counter may again be incremented (e.g., from "1" to "2") and so forth. In some instances, the counter may be reset each time the memory system 510 reboots.

At 538, the host system 505 may compare a value of the counter to a threshold value, which may be less than the total quantity of errors that the ECC is capable of correcting. For example, the ECC may be configured to correct a fixed quantity of errors and the threshold may be based off of the fixed quantity (e.g., threshold=¾×maximum quantity of correctable errors). By setting the threshold value less than the total quantity of errors the ECC is configured to correct, the memory system 510 may be less susceptible to aliasing during subsequent error correction operations. Accordingly, the host system 505 may be configured to compare the value of the counter to the threshold. If the value of the counter satisfies the threshold value, the host system 505 may perform an ECC assessment (e.g., at 539), whereas if the value of the counter does not satisfy the threshold value, the host system 505 may allow the memory system 510 to continue its boot sequence.

At 539, the host system 505 may conduct an ECC assessment based on the value of the counter satisfying the threshold. In a first example, the host system 505 may generate a second ECC using the corrected parameter data. For example, the second ECC may be configured to correct a greater quantity of errors than the originally generated ECC. As such, during subsequent boot operations, the host system 505 may use the second ECC to identify and correct errors, which may allow the host system 505 to correct a larger quantity errors than it was previously capable of. Moreover, upon generating the ECC, the host system 505 may update the threshold value (e.g., the threshold used at block 325) to account for the second ECC being able to correct a larger quantity of errors.

In a second example, the host system 505 may generate multiple ECCs upon the first boot sequence of the memory system 510. As described above, the host system 505 may have generated multiple ECCs (e.g., at 526). Accordingly, when the host system 505 determines that a value of the counter exceeds the threshold quantity of errors correctable by the ECC, the host system 505 may select a new (e.g., a second) ECC for use. The second ECC may be configured to correct a larger quantity of errors than the prior ECC.

In a third example, the host system 505 may store corrected parameter data at different location than the prior parameter data (e.g., the corrupt parameter data) was stored. For example, the corrupt parameter data may be stored at a first portion of the memory device 520 and, upon correction, the corrected parameter data may be stored to a second portion of the memory device 520.

In some instances, some aspects of the process flow diagram 500 may instead be performed by the memory system 510 (e.g., as opposed to the host system 505) as described above with reference to FIG. 4. For example, the generated ECC (e.g., at 526) may instead be generated by the memory controller 515, or the memory controller 515 may identify and correct errors in the parameter data (e.g., at 534), increment the counter (e.g., at 537), compare the counter to a threshold (e.g., at 538), and/or perform an ECC assessment (e.g., at 539). The operations performed by the host system 505 and the memory system 510 may be a matter of design choice that are selected during manufacturing of the respective components. In any instance, by utilizing an ECC to correct errors in parameter data, fewer copies of the parameter data may be stored to the memory device 520, which may improve its overall storage capabilities.

Figure 6:
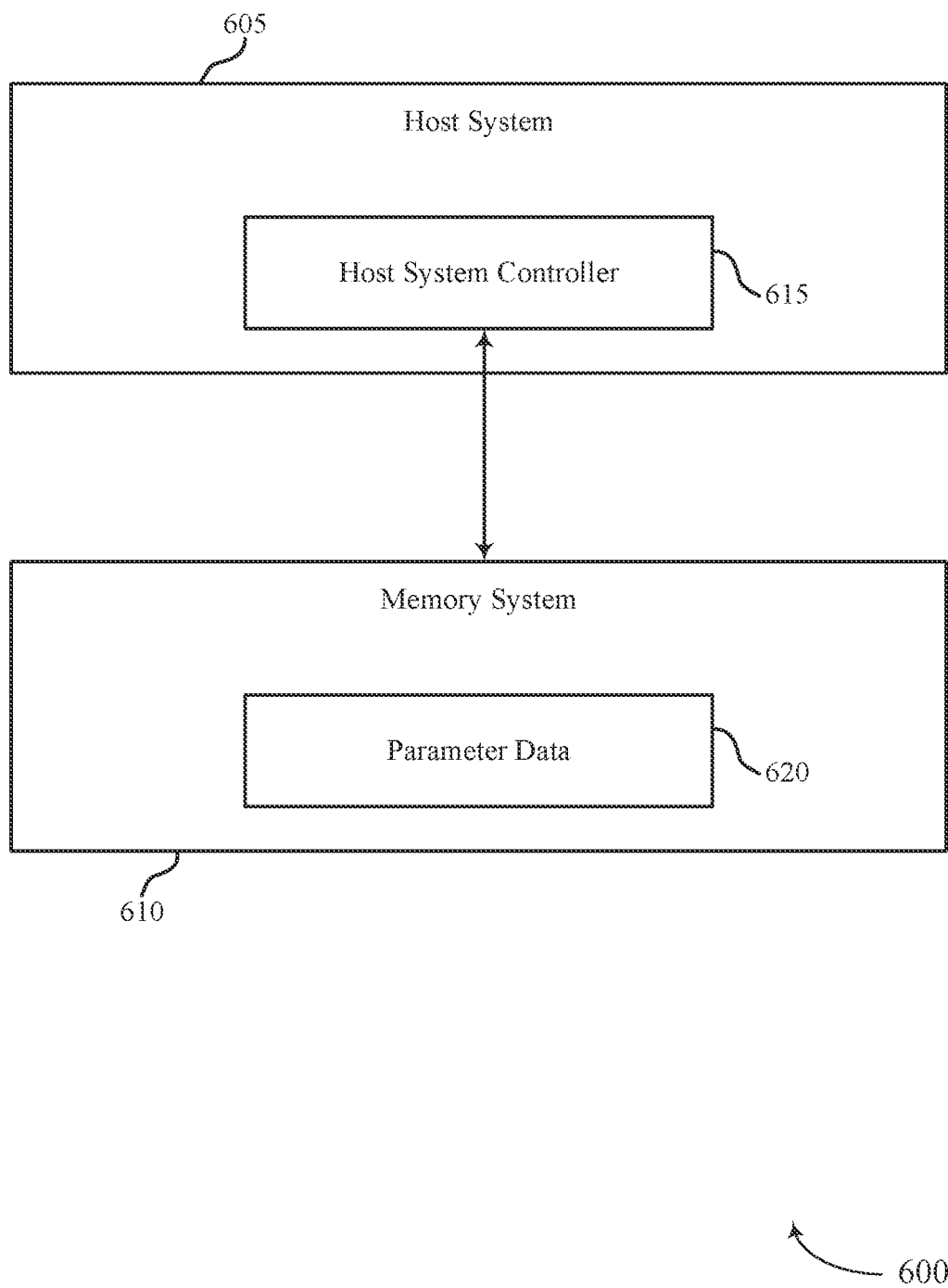
FIG. 6 illustrates a block diagram of a system that supports parameter table protection for a memory system in accordance with examples as disclosed herein.

FIG. 6 illustrates an example of a block diagram 600 that supports parameter table protection for a memory system in accordance with examples as disclosed herein. In some examples, the memory system 610 may implement aspects of system 100, system 200, or a combination thereof. Accordingly, the block diagram 600 may illustrate a host system 605 and a memory system 610. In some examples, the host system 605 may include a host system controller 615 and the memory system 610 may include a parameter data 620, which may refer to a portion of the memory system 610 that is configured to store parameter data 620. In some examples, the memory system 610 may not include a memory controller and thus the host system 605 may have direct access to the memory devices of the memory system 610. The host system controller 615 may be configured to communicate with the memory system 610 to generate an ECC that can be used to identify and correct errors in parameter data. By utilizing an ECC to correct errors in parameter data, fewer copies of the parameter data may be stored to the memory system 610, which may improve its overall storage capabilities.

In a first example, the host system controller 615 may generate one or more ECCs that are associated with the parameter data 620 upon the memory system 610 booting for a first time. As described herein, in some examples the host system controller 615 may generate a single ECC that is configured to correct a fixed quantity of errors in the parameter data during subsequent boot operations. However, in other examples, the host system controller 615 may generate multiple ECCs that are each configured to correct a different fixed quantity of errors. Accordingly, when multiple ECCs are generated, the host system controller 615 may be configured to select a different ECC (e.g., an ECC configured to correct a larger quantity of errors) when a threshold quantity of errors in the parameter data are corrected. Selecting a different ECC when a threshold quantity of errors are correct may prevent aliasing from occurring.

The host system controller 615 may identify and correct errors included in the parameter data 620. In some instances, the host system controller 615 may identify and correct errors in the parameter data 620 by generating an ECC (e.g., a second ECC) based on the current parameter data 620 and comparing the second ECC to the ECC received from the memory system 610 (e.g., that was generated upon the memory system 610 booting for a first time). If the ECCs match, then the parameter data may not include any errors. However, if the ECCs do not match, one or more errors may exist and the host system controller 615 may use the ECC received from the memory system 610 to correct the parameter data as described herein.

The host system controller 615 may store the corrected parameter data 620 to the memory system 610. In some examples, the host system controller 615 may overwrite the existing parameter data 620 with the corrected parameter data 620, whereas in other examples the host system controller 615 may save the parameter data to a different location of the memory system 610.

In another example, the memory system 610 may include ECC capabilities and thus the host system controller 615 may initiate the generation of one or more ECCs by the memory system 610. That is, upon the memory system 610 booting for a first time, the host system controller 615 may initiate the generation of one or more ECCs (e.g., by an ECC engine or other circuitry associated with the memory system 610) configured to correct errors in the parameter data 620. The host system controller 615 may then, upon the memory system 610 booting for a subsequent time, initiate the correction of the parameter data 620 using the generated ECC(s). Accordingly, in the examples described herein with reference to FIG. 6, the host system 605 (e.g., the host system controller 615) may correct the parameter data 620 or initiate the correction of the parameter data 620 by the memory system 610. In either instance, by utilizing an ECC to correct errors in parameter data, fewer copies of the parameter data may be stored to the memory system 610, which may improve its overall storage capabilities.

Figure 7:
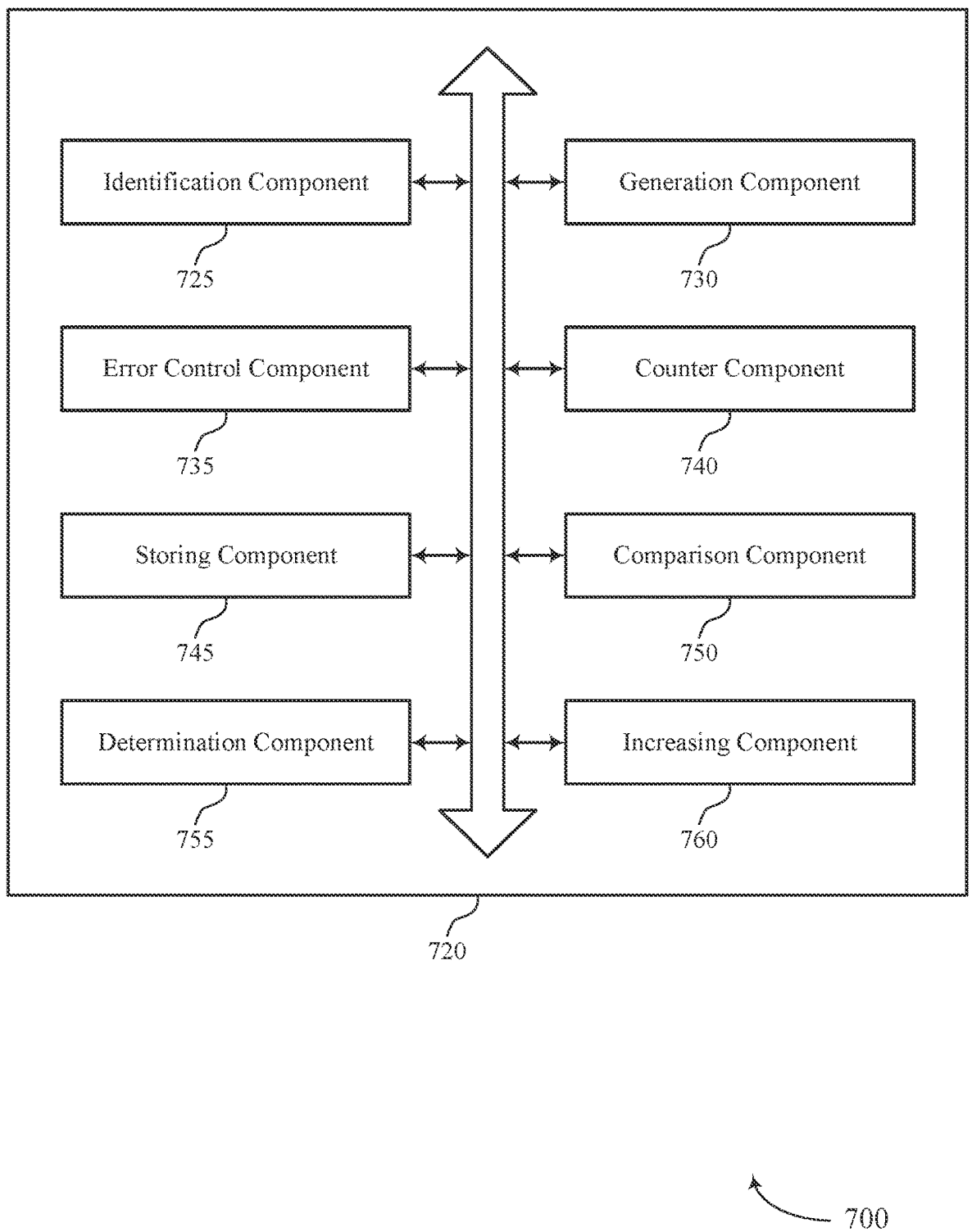
FIG. 7 shows a block diagram of a memory system that supports parameter table protection for a memory system in accordance with examples as disclosed herein.

FIG. 7 shows a block diagram 700 of a memory system 720 that supports parameter table protection for a memory system in accordance with examples as disclosed herein. The memory system 720 may be an example of aspects of a memory system as described with reference to FIGS. 1 through 6. The memory system 720, or various components thereof, may be an example of means for performing various aspects of parameter table protection for a memory system as described herein. For example, the memory system 720 may include an identification component 725, a generation component 730, an error control component 735, a counter component 740, a storing component 745, a comparison component 750, a determination component 755, an increasing component 760, or any combination thereof. Each of these components may communicate, directly or indirectly, with one another (e.g., via one or more buses).

The identification component 725 may be configured as or otherwise support a means for identifying, upon booting a memory system for a first occurrence, parameter data for operating the memory system stored to a non-volatile memory device of the memory system. In some examples, the identification component 725 may be configured as or otherwise support a means for identifying, upon booting the memory system for a second occurrence, a first error associated with the parameter data using the ECC. In some examples, the identification component 725 may be configured as or otherwise support a means for identifying, upon booting the memory system for a third occurrence, a second error associated with the parameter data using the generated ECC.

The generation component 730 may be configured as or otherwise support a means for generating, at the memory system, an ECC associated with the parameter data based on identifying the parameter data stored to the non-volatile memory device of the memory system.

The error control component 735 may be configured as or otherwise support a means for correcting, at the memory system, the first error associated with the parameter data based on identifying the first error. In some examples, the error control component 735 may be configured as or otherwise support a means for correcting, at the memory system, the second error associated with the parameter data based on identifying the second error associated with the parameter data and incrementing the counter.

In some examples, the error control component 735 may be configured as or otherwise support a means for selecting a fourth ECC for correcting a fourth quantity of errors associated with the parameter data based on determining that the value of the counter is above the first threshold value and below the second threshold value, where the fourth ECC is configured to correct a quantity of errors that is greater than the first threshold value. In some examples, the error control component 735 may be configured as or otherwise support a means for selecting a third ECC for correcting a third quantity of errors associated with the parameter data based on determining that the value of the counter satisfies the threshold value, where the third ECC is configured to correct a quantity of errors that is greater than the threshold value.

In some examples, the error control component 735 may be configured as or otherwise support a means for generating, at the memory system, a second ECC associated with the parameter data based on determining that the value of the counter satisfies the threshold value, where the second ECC is configured to correct a second quantity of errors greater than the first quantity of errors correctable by the ECC. In some examples, the error control component 735 may be configured as or otherwise support a means for replacing the ECC with the second ECC based on generating the second ECC associated with the parameter data.

In some examples, the counter component 740 may be configured as or otherwise support a means for incrementing a counter based on correcting the first error associated with the parameter data, where a value of the counter is associated with a quantity of corrected errors of the parameter data. In some examples, the counter component 740 may be configured as or otherwise support a means for incrementing the counter based on identifying the second error associated with the parameter data.

In some examples, the parameter data is stored to a first portion of the non-volatile memory device of the memory system, and the storing component 745 may be configured as or otherwise support a means for storing the corrected parameter data to a second portion of the non-volatile memory device of the memory system that is different than the first portion of the non-volatile memory device of the memory system.

In some examples, the comparison component 750 may be configured as or otherwise support a means for comparing the value of the counter to a threshold value associated with the ECC based on incrementing the counter, where correcting the first error associated with the parameter data is based on the value of the counter failing to satisfy the threshold value.

In some examples, the determination component 755 may be configured as or otherwise support a means for determining that the value of the counter satisfies a threshold value associated with a first quantity of errors correctable by the ECC based on incrementing the counter. In some examples, the determination component 755 may be configured as or otherwise support a means for determining that the value of the counter is above a first threshold value associated with a first quantity of errors correctable by the ECC and below a second threshold value associated with a second quantity of errors correctable by the ECC based on incrementing the counter. In some examples, the determination component 755 may be configured as or otherwise support a means for determining that the value of the counter satisfies a threshold value associated with a first quantity of errors correctable by the ECC based on incrementing the counter.

In some examples, the increasing component 760 may be configured as or otherwise support a means for increasing the threshold value based on selecting the third ECC for correcting the third quantity of errors associated with the parameter data. In some examples, the increasing component 760 may be configured as or otherwise support a means for increasing the threshold value based on generating the second ECC for correcting the second quantity of errors associated with the parameter data.

In some examples, the threshold value is based on a quantity of errors that are correctable by the ECC.

Figure 8:
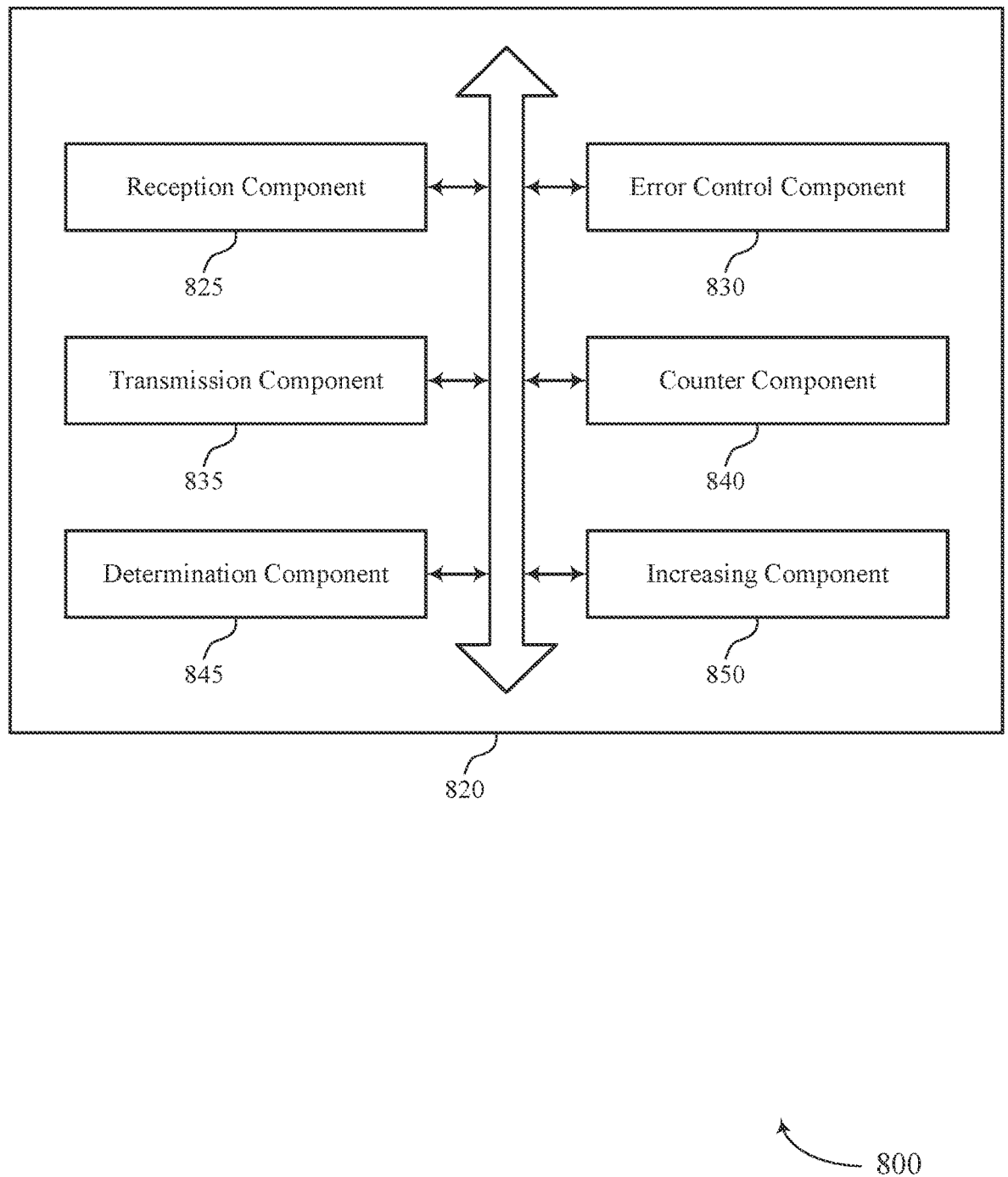
FIG. 8 shows a block diagram of a host system that supports parameter table protection for a memory system in accordance with examples as disclosed herein.

FIG. 8 shows a block diagram 800 of a host system 820 that supports parameter table protection for a memory system in accordance with examples as disclosed herein. The host system 820 may be an example of aspects of a host system as described with reference to FIGS. 1 through 6. The host system 820, or various components thereof, may be an example of means for performing various aspects of parameter table protection for a memory system as described herein. For example, the host system 820 may include a reception component 825, an error control component 830, a transmission component 835, a counter component 840, a determination component 845, an increasing component 850, or any combination thereof. Each of these components may communicate, directly or indirectly, with one another (e.g., via one or more buses).

The reception component 825 may be configured as or otherwise support a means for receiving, at a host system, parameter data for operating a memory system based on the memory system being booted for a first occurrence. In some examples, the reception component 825 may be configured as or otherwise support a means for receiving, at the host system, the parameter data from the memory system based on the memory system being booted for a second occurrence and after transmitting the ECC associated with the parameter data to the memory system. In some examples, the reception component 825 may be configured as or otherwise support a means for receiving, at the host system, the parameter data from the memory system based on the memory system being booted for a third occurrence.

The error control component 830 may be configured as or otherwise support a means for generating, at the host system, an ECC associated with the parameter data based on receiving the parameter data from the memory system. In some examples, the error control component 830 may be configured as or otherwise support a means for correcting, at the host system, a first error associated with the parameter data based on receiving the parameter data from the memory system. In some examples, the error control component 830 may be configured as or otherwise support a means for comparing the value of the counter to a threshold value associated with the ECC based on incrementing the counter, where correcting the first error associated with the parameter data is based on the value of the counter failing to satisfy the threshold value.

In some examples, the error control component 830 may be configured as or otherwise support a means for generating, at the host system, a second ECC associated with the parameter data based at least in part determining that the value of the counter satisfies the threshold value, where the second ECC is configured to correct a second quantity of errors that is greater than the first quantity of errors correctable by the ECC. In some examples, the error control component 830 may be configured as or otherwise support a means for identifying a second error associated with the parameter data based on receiving the parameter data upon the memory system being booted for the third occurrence. In some examples, the error control component 830 may be configured as or otherwise support a means for correcting, at the host system, the second error associated with the parameter data based on identifying the second error and incrementing the counter.

In some examples, the error control component 830 may be configured as or otherwise support a means for selecting a third ECC for correcting a third quantity of errors associated with the parameter data based on determining that the value of the counter satisfies the threshold value, where the third ECC is configured to correct a quantity of errors that is greater than the threshold value. In some examples, the error control component 830 may be configured as or otherwise support a means for selecting a fourth ECC for correcting a fourth quantity of errors associated with the parameter data based on determining that the value of the counter is above the first threshold value and below the second threshold value, where the fourth ECC is configured to correct a quantity of errors that is greater than the first threshold value.

The transmission component 835 may be configured as or otherwise support a means for transmitting the ECC associated with the parameter data to the memory system based on generating the ECC associated with the parameter data. In some examples, the transmission component 835 may be configured as or otherwise support a means for transmitting corrected parameter data to the memory system based on correcting the first error associated with the parameter data. In some examples, the transmission component 835 may be configured as or otherwise support a means for transmitting the second ECC to the memory system based on generating the second ECC.

In some examples, the counter component 840 may be configured as or otherwise support a means for incrementing a counter based on correcting the first error associated with the parameter data, where a value of the counter is associated with a quantity of corrected errors of the parameter data. In some examples, the counter component 840 may be configured as or otherwise support a means for incrementing the counter based on identifying the second error associated with the parameter data.

In some examples, the counter component 840 may be configured as or otherwise support a means for determining that the value of the counter is above a first threshold value associated with a first quantity of errors correctable by the ECC and below a second threshold value associated with a second quantity of errors correctable by the ECC based on incrementing the counter.

In some examples, the determination component 845 may be configured as or otherwise support a means for determining that the value of the counter satisfies a threshold value associated with a first quantity of errors correctable by the ECC based on incrementing the counter. In some examples, the determination component 845 may be configured as or otherwise support a means for determining that the value of the counter satisfies a threshold value associated with a first quantity of errors correctable by the ECC based on incrementing the counter.

In some examples, the increasing component 850 may be configured as or otherwise support a means for increasing the threshold value based on generating the second ECC for correcting the second quantity of errors associated with the parameter data. In some examples, the increasing component 850 may be configured as or otherwise support a means for increasing the threshold value based on selecting the third ECC for correcting the third quantity of errors associated with the parameter data.

In some examples, the threshold value is based on a quantity of errors that are correctable by the ECC.

Figure 9:
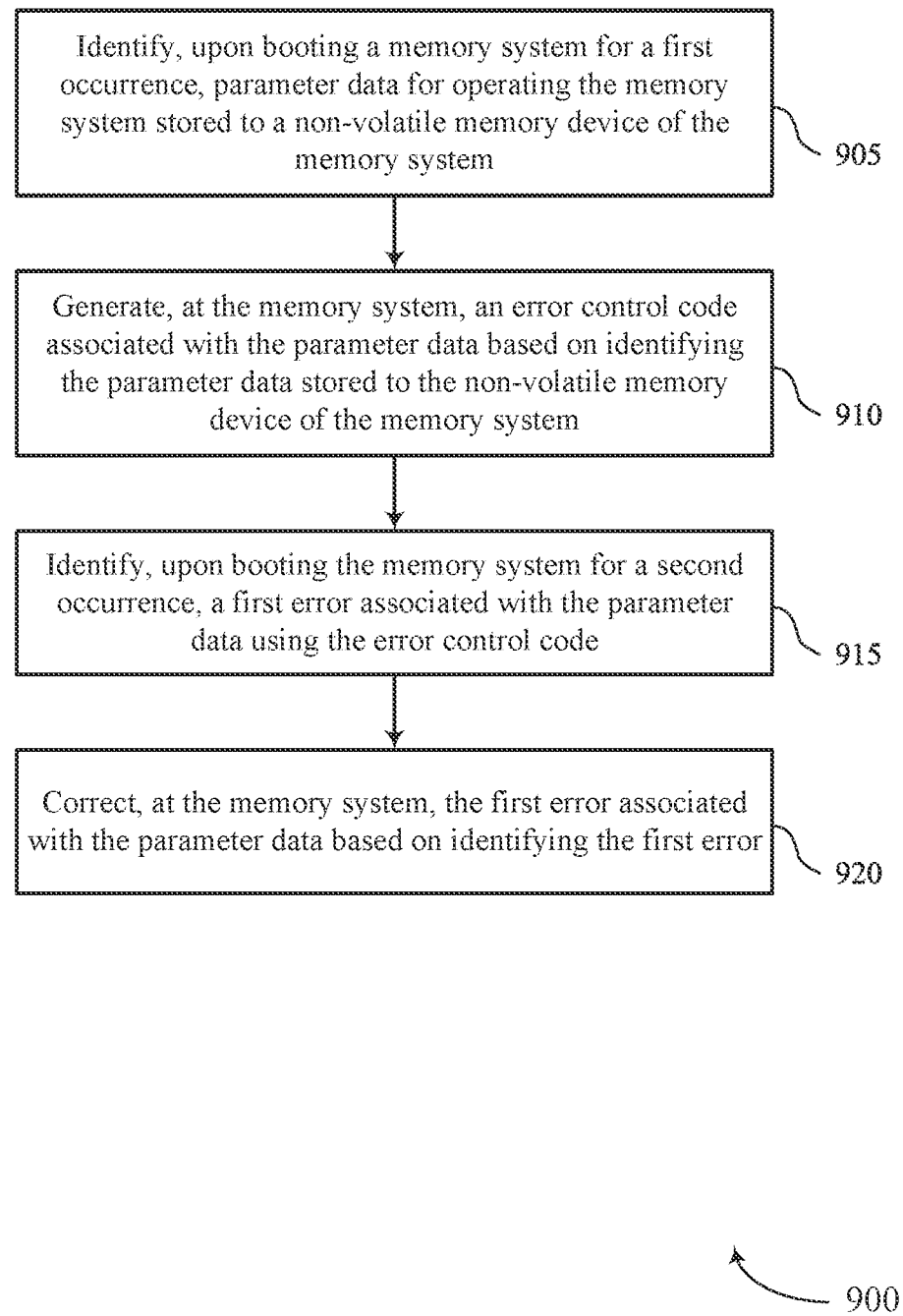
FIGS. 9 and 10 show flowcharts illustrating a method or methods that support parameter table protection for a memory system in accordance with examples as disclosed herein.

FIG. 9 shows a flowchart illustrating a method 900 that supports parameter table protection for a memory system in accordance with examples as disclosed herein. The operations of method 900 may be implemented by a memory system or its components as described herein. For example, the operations of method 900 may be performed by a memory system as described with reference to FIGS. 1 through 7. In some examples, a memory system may execute a set of instructions to control the functional elements of the device to perform the described functions. Additionally or alternatively, the memory system may perform aspects of the described functions using special-purpose hardware.

At 905, the method may include identifying, upon booting a memory system for a first occurrence, parameter data for operating the memory system stored to a non-volatile memory device of the memory system. The operations of 905 may be performed in accordance with examples as disclosed herein. In some examples, aspects of the operations of 905 may be performed by an identification component 725 as described with reference to FIG. 7.

At 910, the method may include generating, at the memory system, an ECC associated with the parameter data based on identifying the parameter data stored to the non-volatile memory device of the memory system. The operations of 910 may be performed in accordance with examples as disclosed herein. In some examples, aspects of the operations of 910 may be performed by a generation component 730 as described with reference to FIG. 7.

At 915, the method may include identifying, upon booting the memory system for a second occurrence, a first error associated with the parameter data using the ECC. The operations of 915 may be performed in accordance with examples as disclosed herein. In some examples, aspects of the operations of 915 may be performed by an identification component 725 as described with reference to FIG. 7.

At 920, the method may include correcting, at the memory system, the first error associated with the parameter data based on identifying the first error. The operations of 920 may be performed in accordance with examples as disclosed herein. In some examples, aspects of the operations of 920 may be performed by an error control component 735 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for identifying, upon booting a memory system for a first occurrence, parameter data for operating the memory system stored to a non-volatile memory device of the memory system; generating, at the memory system, an ECC associated with the parameter data based on identifying the parameter data stored to the non-volatile memory device of the memory system; identifying, upon booting the memory system for a second occurrence, a first error associated with the parameter data using the ECC; and correcting, at the memory system, the first error associated with the parameter data based on identifying the first error.

Aspect 2: The apparatus of aspect 1, further including operations, features, circuitry, logic, means, or instructions, or any combination thereof for incrementing a counter based on correcting the first error associated with the parameter data, where a value of the counter is associated with a quantity of corrected errors of the parameter data.

Aspect 3: The apparatus of aspect 2, further including operations, features, circuitry, logic, means, or instructions, or any combination thereof for comparing the value of the counter to a threshold value associated with the ECC based on incrementing the counter, where correcting the first error associated with the parameter data is based on the value of the counter failing to satisfy the threshold value.

Aspect 4: The apparatus of aspect 3, further including operations, features, circuitry, logic, means, or instructions, or any combination thereof for the threshold value is based on a quantity of errors that are correctable by the ECC.

Aspect 5: The apparatus of any of aspects 2 through 4, further including operations, features, circuitry, logic, means, or instructions, or any combination thereof for identifying, upon booting the memory system for a third occurrence, a second error associated with the parameter data using the generated ECC; incrementing the counter based on identifying the second error associated with the parameter data; and correcting, at the memory system, the second error associated with the parameter data based on identifying the second error associated with the parameter data and incrementing the counter.

Aspect 6: The apparatus of aspect 5, further including operations, features, circuitry, logic, means, or instructions, or any combination thereof for determining that the value of the counter satisfies a threshold value associated with a first quantity of errors correctable by the ECC based on incrementing the counter and selecting a third ECC for correcting a third quantity of errors associated with the parameter data based on determining that the value of the counter satisfies the threshold value, where the third ECC is configured to correct a quantity of errors that is greater than the threshold value.

Aspect 7: The apparatus of aspect 6, further including operations, features, circuitry, logic, means, or instructions, or any combination thereof for increasing the threshold value based on selecting the third ECC for correcting the third quantity of errors associated with the parameter data.

Aspect 8: The apparatus of any of aspects 5 through 7, further including operations, features, circuitry, logic, means, or instructions, or any combination thereof for determining that the value of the counter is above a first threshold value associated with a first quantity of errors correctable by the ECC and below a second threshold value associated with a second quantity of errors correctable by the ECC based on incrementing the counter and selecting a fourth ECC for correcting a fourth quantity of errors associated with the parameter data based on determining that the value of the counter is above the first threshold value and below the second threshold value, where the fourth ECC is configured to correct a quantity of errors that is greater than the first threshold value.

Aspect 9: The apparatus of any of aspects 2 through 8, further including operations, features, circuitry, logic, means, or instructions, or any combination thereof for determining that the value of the counter satisfies a threshold value associated with a first quantity of errors correctable by the ECC based on incrementing the counter and generating, at the memory system, a second ECC associated with the parameter data based on determining that the value of the counter satisfies the threshold value, where the second ECC is configured to correct a second quantity of errors greater than the first quantity of errors correctable by the ECC.

Aspect 10: The apparatus of aspect 9, further including operations, features, circuitry, logic, means, or instructions, or any combination thereof for replacing the ECC with the second ECC based on generating the second ECC associated with the parameter data.

Aspect 11: The apparatus of any of aspects 9 through 10, further including operations, features, circuitry, logic, means, or instructions, or any combination thereof for increasing the threshold value based on generating the second ECC for correcting the second quantity of errors associated with the parameter data.

Aspect 12: The apparatus of any of aspects 1 through 11 where the parameter data is stored to a first portion of the non-volatile memory device of the memory system and the method, apparatuses, and non-transitory computer-readable medium, further includes operations, features, circuitry, logic, means, or instructions, or any combination thereof for storing the corrected parameter data to a second portion of the non-volatile memory device of the memory system that is different than the first portion of the non-volatile memory device of the memory system.

Figure 10:
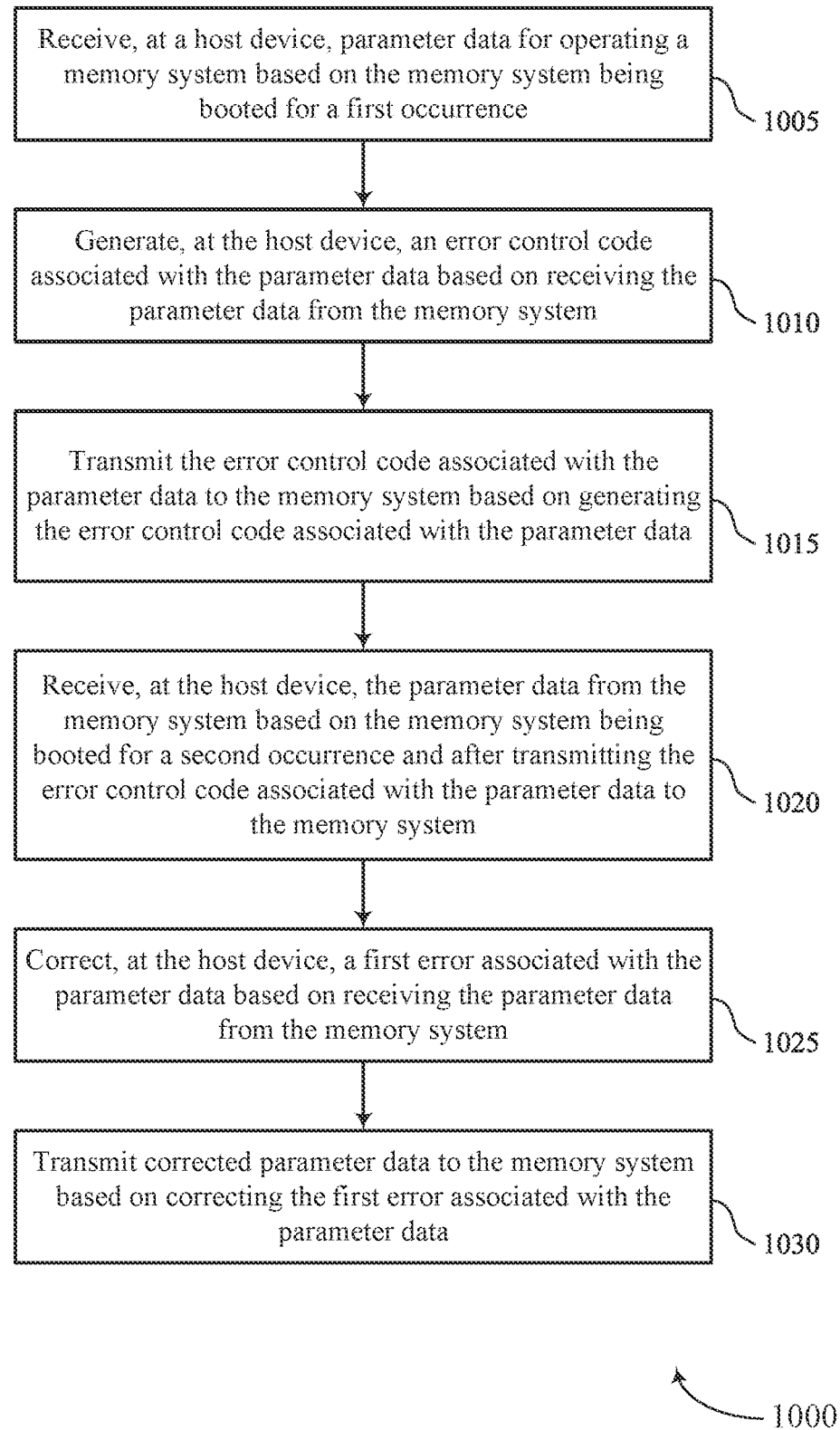

FIG. 10 shows a flowchart illustrating a method 1000 that supports parameter table protection for a memory system in accordance with examples as disclosed herein. The operations of method 1000 may be implemented by a host system or its components as described herein. For example, the operations of method 1000 may be performed by a host system as described with reference to FIGS. 1 through 6 and 8. In some examples, a host system may execute a set of instructions to control the functional elements of the device to perform the described functions. Additionally or alternatively, the host system may perform aspects of the described functions using special-purpose hardware.

At 1005, the method may include receiving, at a host system, parameter data for operating a memory system based on the memory system being booted for a first occurrence. The operations of 1005 may be performed in accordance with examples as disclosed herein. In some examples, aspects of the operations of 1005 may be performed by a reception component 825 as described with reference to FIG. 8.

At 1010, the method may include generating, at the host system, an ECC associated with the parameter data based on receiving the parameter data from the memory system. The operations of 1010 may be performed in accordance with examples as disclosed herein. In some examples, aspects of the operations of 1010 may be performed by an error control component 830 as described with reference to FIG. 8.

At 1015, the method may include transmitting the ECC associated with the parameter data to the memory system based on generating the ECC associated with the parameter data. The operations of 1015 may be performed in accordance with examples as disclosed herein. In some examples, aspects of the operations of 1015 may be performed by a transmission component 835 as described with reference to FIG. 8.

At 1020, the method may include receiving, at the host system, the parameter data from the memory system based on the memory system being booted for a second occurrence and after transmitting the ECC associated with the parameter data to the memory system. The operations of 1020 may be performed in accordance with examples as disclosed herein.

In some examples, aspects of the operations of 1020 may be performed by a reception component 825 as described with reference to FIG. 8.

At 1025, the method may include correcting, at the host system, a first error associated with the parameter data based on receiving the parameter data from the memory system. The operations of 1025 may be performed in accordance with examples as disclosed herein. In some examples, aspects of the operations of 1025 may be performed by an error control component 830 as described with reference to FIG. 8.

At 1030, the method may include transmitting corrected parameter data to the memory system based on correcting the first error associated with the parameter data. The operations of 1030 may be performed in accordance with examples as disclosed herein. In some examples, aspects of the operations of 1030 may be performed by a transmission component 835 as described with reference to FIG. 8.

In some examples, an apparatus as described herein may perform a method or methods, such as the method 1000. The apparatus may include, features, circuitry, logic, means, or instructions (e.g., a non-transitory computer-readable medium storing instructions executable by a processor), or any combination thereof for performing the following aspects of the present disclosure:

Aspect 13: The apparatus, including features, circuitry, logic, means, or instructions, or any combination thereof for receiving, at a host system, parameter data for operating a memory system based on the memory system being booted for a first occurrence; generating, at the host system, an ECC associated with the parameter data based on receiving the parameter data from the memory system; transmitting the ECC associated with the parameter data to the memory system based on generating the ECC associated with the parameter data; receiving, at the host system, the parameter data from the memory system based on the memory system being booted for a second occurrence and after transmitting the ECC associated with the parameter data to the memory system; correcting, at the host system, a first error associated with the parameter data based on receiving the parameter data from the memory system; and transmitting corrected parameter data to the memory system based on correcting the first error associated with the parameter data.

Aspect 14: The apparatus of aspect 13, further including operations, features, circuitry, logic, means, or instructions, or any combination thereof for incrementing a counter based on correcting the first error associated with the parameter data, where a value of the counter is associated with a quantity of corrected errors of the parameter data.

Aspect 15: The apparatus of aspect 14, further including operations, features, circuitry, logic, means, or instructions, or any combination thereof for determining that the value of the counter satisfies a threshold value associated with a first quantity of errors correctable by the ECC based on incrementing the counter; generating, at the host system, a second ECC associated with the parameter data based at least in part determining that the value of the counter satisfies the threshold value, where the second ECC is configured to correct a second quantity of errors that is greater than the first quantity of errors correctable by the ECC; and transmitting the second ECC to the memory system based on generating the second ECC.

Aspect 16: The apparatus of aspect 15, further including operations, features, circuitry, logic, means, or instructions, or any combination thereof for increasing the threshold value based on generating the second ECC for correcting the second quantity of errors associated with the parameter data.

Aspect 17: The apparatus of any of aspects 14 through 16, further including operations, features, circuitry, logic, means, or instructions, or any combination thereof for comparing the value of the counter to a threshold value associated with the ECC based at least in part on incrementing the counter, where correcting the first error associated with the parameter data is based on the value of the counter failing to satisfy the threshold value.

Aspect 18: The apparatus of aspect 17, further including operations, features, circuitry, logic, means, or instructions, or any combination thereof for the threshold value is based on a quantity of errors that are correctable by the ECC.

Aspect 19: The apparatus of any of aspects 14 through 18, further including operations, features, circuitry, logic, means, or instructions, or any combination thereof for receiving, at the host system, the parameter data from the memory system based on the memory system being booted for a third occurrence; identifying a second error associated with the parameter data based on receiving the parameter data upon the memory system being booted for the third occurrence; incrementing the counter based on identifying the second error associated with the parameter data; and correcting, at the host system, the second error associated with the parameter data based on identifying the second error and incrementing the counter.

Aspect 20: The apparatus of aspect 19, further including operations, features, circuitry, logic, means, or instructions, or any combination thereof for determining that the value of the counter satisfies a threshold value associated with a first quantity of errors correctable by the ECC based on incrementing the counter and selecting a third ECC for correcting a third quantity of errors associated with the parameter data based on determining that the value of the counter satisfies the threshold value, where the third ECC is configured to correct a quantity of errors that is greater than the threshold value.

Aspect 21: The apparatus of aspect 20, further including operations, features, circuitry, logic, means, or instructions, or any combination thereof for increasing the threshold value based on selecting the third ECC for correcting the third quantity of errors associated with the parameter data.

Aspect 22: The apparatus of any of aspects 19 through 21, further including operations, features, circuitry, logic, means, or instructions, or any combination thereof for determining that the value of the counter is above a first threshold value associated with a first quantity of errors correctable by the ECC and below a second threshold value associated with a second quantity of errors correctable by the ECC based on incrementing the counter and selecting a fourth ECC for correcting a fourth quantity of errors associated with the parameter data based on determining that the value of the counter is above the first threshold value and below the second threshold value, where the fourth ECC is configured to correct a quantity of errors that is greater than the first threshold value.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based on" may be used interchangeably. In some examples, if the terms "if," "when," "based on," or "based on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   identifying, upon booting a memory system for a first occurrence, parameter data for operating the memory system stored to a non-volatile memory device of the memory system;
   generating, at the memory system, a first error control code associated with the parameter data based at least in part on identifying the parameter data stored to the non-volatile memory device of the memory system, the first error control code for correcting a first quantity of errors;
   identifying, upon booting the memory system for a second occurrence, a first error associated with the parameter data using the first error control code;
   correcting, at the memory system, the first error associated with the parameter data based at least in part on identifying the first error; and
   generating, at the memory system, a second error control code associated with the parameter data based at least in part on correcting the parameter data, the second error control code for correcting a second quantity of errors different than the first quantity of errors.

2. The method of claim 1, further comprising:
   incrementing a counter based at least in part on correcting the first error associated with the parameter data, wherein a value of the counter is associated with a quantity of corrected errors of the parameter data.

3. The method of claim 2, further comprising:
   comparing the value of the counter to a threshold value associated with the first error control code based at least in part on incrementing the counter, wherein correcting the first error associated with the parameter data is based at least in part on the value of the counter failing to satisfy the threshold value.

4. The method of claim 3, wherein the threshold value is based at least in part on the first quantity of errors that are correctable by the first error control code.

5. The method of claim 2, further comprising:
   identifying, upon booting the memory system for a third occurrence, a second error associated with the parameter data using the first error control code;
   incrementing the counter based at least in part on identifying the second error associated with the parameter data; and
   correcting, at the memory system, the second error associated with the parameter data based at least in part on identifying the second error associated with the parameter data and incrementing the counter.

6. The method of claim 5, further comprising:
   determining that the value of the counter satisfies a threshold value associated with the first quantity of errors correctable by the first error control code based at least in part on incrementing the counter; and
   selecting the second error control code based at least in part on determining that the value of the counter satisfies the threshold value, wherein the second quantity of errors is greater than the threshold value.

7. The method of claim 6, further comprising:
   increasing the threshold value based at least in part on selecting the second error control code for correcting the second quantity of errors associated with the parameter data.

8. The method of claim 5, further comprising:
   determining that the value of the counter is above a first threshold value associated with the first quantity of errors correctable by the first error control code and below a second threshold value associated with a third quantity of errors correctable by the first error control code based at least in part on incrementing the counter; and
   selecting the second error control code based at least in part on determining that the value of the counter is above the first threshold value and below the second threshold value, wherein the second quantity of errors is greater than the first threshold value.

9. The method of claim 2, further comprising:
   determining that the value of the counter satisfies a threshold value associated with the first quantity of errors correctable by the first error control code based at least in part on incrementing the counter; and generating, at the memory system, the second error control code associated with the parameter data based at least in part on determining that the value of the counter satisfies the threshold value, wherein the second quantity of errors is greater than the first quantity of errors correctable by the first error control code.

10. The method of claim 9, further comprising:
replacing the first error control code with the second error control code based at least in part on generating the second error control code associated with the parameter data.

11. The method of claim 9, further comprising:
increasing the threshold value based at least in part on generating the second error control code for correcting the second quantity of errors associated with the parameter data.

12. The method of claim 1, wherein the parameter data is stored to a first portion of the non-volatile memory device of the memory system, the method further comprising:
storing the corrected parameter data to a second portion of the non-volatile memory device of the memory system that is different than the first portion of the non-volatile memory device of the memory system.

13. A method, comprising:
receiving, at a host system, parameter data for operating a memory system based at least in part on the memory system being booted for a first occurrence;
generating, at the host system, an error control code associated with the parameter data based at least in part on receiving the parameter data from the memory system;
transmitting the error control code associated with the parameter data to the memory system based at least in part on generating the error control code associated with the parameter data;
receiving, at the host system, the parameter data and the error control code from the memory system based at least in part on the memory system being booted for a second occurrence and after transmitting the error control code associated with the parameter data to the memory system;
correcting, at the host system, a first error associated with the parameter data based at least in part on receiving the parameter data and the error control code from the memory system; and
transmitting corrected parameter data to the memory system based at least in part on correcting the first error associated with the parameter data.

14. The method of claim 13, further comprising:
incrementing a counter based at least in part on correcting the first error associated with the parameter data, wherein a value of the counter is associated with a quantity of corrected errors of the parameter data.

15. The method of claim 14, further comprising:
determining that the value of the counter satisfies a threshold value associated with a first quantity of errors correctable by the error control code based at least in part on incrementing the counter;
generating, at the host system, a second error control code associated with the parameter data based at least in part on determining that the value of the counter satisfies the threshold value, wherein the second error control code is configured to correct a second quantity of errors that is greater than the first quantity of errors correctable by the error control code; and
transmitting the second error control code to the memory system based at least in part on generating the second error control code.

16. The method of claim 15, further comprising:
increasing the threshold value based at least in part on generating the second error control code for correcting the second quantity of errors associated with the parameter data.

17. The method of claim 14, further comprising:
comparing the value of the counter to a threshold value associated with the error control code based at least in part on incrementing the counter, wherein correcting the first error associated with the parameter data is based at least in part on the value of the counter failing to satisfy the threshold value.

18. The method of claim 17, wherein the threshold value is based at least in part on a quantity of errors that are correctable by the error control code.

19. The method of claim 14, further comprising:
receiving, at the host system, the parameter data from the memory system based at least in part on the memory system being booted for a third occurrence;
identifying a second error associated with the parameter data based at least in part on receiving the parameter data upon the memory system being booted for the third occurrence;
incrementing the counter based at least in part on identifying the second error associated with the parameter data; and
correcting, at the host system, the second error associated with the parameter data based at least in part on identifying the second error and incrementing the counter.

20. The method of claim 19, further comprising:
determining that the value of the counter satisfies a threshold value associated with a first quantity of errors correctable by the error control code based at least in part on incrementing the counter; and
selecting a third error control code for correcting a third quantity of errors associated with the parameter data based at least in part on determining that the value of the counter satisfies the threshold value, wherein the third error control code is configured to correct a quantity of errors that is greater than the threshold value.

21. The method of claim 20, further comprising:
increasing the threshold value based at least in part on selecting the third error control code for correcting the third quantity of errors associated with the parameter data.

22. The method of claim 19, further comprising:
determining that the value of the counter is above a first threshold value associated with a first quantity of errors correctable by the error control code and below a second threshold value associated with a second quantity of errors correctable by the error control code based at least in part on incrementing the counter; and
selecting a fourth error control code for correcting a fourth quantity of errors associated with the parameter data based at least in part on determining that the value of the counter is above the first threshold value and below the second threshold value, wherein the fourth error control code is configured to correct a quantity of errors that is greater than the first threshold value.

23. A non-transitory computer-readable medium storing code, the code comprising instructions executable by a processor to:

identify, upon booting a memory system for a first occurrence, parameter data for operating the memory system stored to a non-volatile memory device of the memory system;

generate, at the memory system, a first error control code associated with the parameter data based at least in part on identifying the parameter data stored to the non-volatile memory device of the memory system, the first error control code for correcting a first quantity of errors;

identify, upon booting the memory system for a second occurrence, a first error associated with the parameter data using the first error control code;

correct, at the memory system, the first error associated with the parameter data based at least in part on identifying the first error; and generate, at the memory system, a second error control code associated with the parameter data based at least in part on correcting the parameter data, the second error control code for correcting a second quantity of errors different than the first quantity of errors.

24. The non-transitory computer-readable medium of claim 23, wherein the instructions are further executable by the processor to:

increment a counter based at least in part on correcting the first error associated with the parameter data, wherein a value of the counter is associated with a quantity of corrected errors of the parameter data.

25. A non-transitory computer-readable medium storing code, the code comprising instructions executable by a processor to:

receive, at a host system, parameter data for operating a memory system based at least in part on the memory system being booted for a first occurrence;

generate, at the host system, an error control code associated with the parameter data based at least in part on receiving the parameter data from the memory system;

transmit the error control code associated with the parameter data to the memory system based at least in part on generating the error control code associated with the parameter data;

receive, at the host system, the parameter data and the error control code from the memory system based at least in part on the memory system being booted for a second occurrence and after transmitting the error control code associated with the parameter data to the memory system;

correct, at the host system, a first error associated with the parameter data based at least in part on receiving the parameter data and the error control code from the memory system; and transmit corrected parameter data to the memory system based at least in part on correcting the first error associated with the parameter data.

* * * * *